(12) United States Patent
Aoki et al.

(10) Patent No.: US 6,870,256 B2
(45) Date of Patent: Mar. 22, 2005

(54) SEMICONDUCTOR DEVICE HAVING A THIN-FILM CIRCUIT ELEMENT PROVIDED ABOVE AN INTEGRATED CIRCUIT

(75) Inventors: Yutaka Aoki, Ome (JP); Ichiro Mihara, Tachikawa (JP); Takeshi Wakabayashi, Sayama (JP); Katsumi Watanabe, Kunitachi (JP)

(73) Assignee: Casio Computer Co., Ltd., Tokyo (JP)

( * ) Notice: Subject to any disclaimer, the term of this patent is extended or adjusted under 35 U.S.C. 154(b) by 0 days.

(21) Appl. No.: 10/254,222

(22) Filed: Sep. 25, 2002

(65) Prior Publication Data

US 2003/0038331 A1 Feb. 27, 2003

Related U.S. Application Data

(63) Continuation of application No. 09/499,599, filed on Feb. 7, 2000, now Pat. No. 6,545,354.

(30) Foreign Application Priority Data

Feb. 15, 1999 (JP) ............................................. 11-035759

(51) Int. Cl.⁷ ...................... H01L 23/522; H01L 23/50
(52) U.S. Cl. ........................ 257/700; 257/758; 257/786
(58) Field of Search ................................ 257/528–543, 257/678–796; 438/238, 381–399

(56) References Cited

U.S. PATENT DOCUMENTS

| | | | |
|---|---|---|---|
| 4,322,778 A | | 3/1982 | Barbour et al. |
| 4,617,193 A | | 10/1986 | Wu |
| 4,811,082 A | | 3/1989 | Jacobs et al. |
| 4,903,116 A | | 2/1990 | Kohsiek |
| 5,258,886 A | | 11/1993 | Murayama et al. |
| 5,317,433 A | | 5/1994 | Miyawaki et al. |
| 5,510,758 A | * | 4/1996 | Fujita et al. ................. 333/247 |
| 5,530,288 A | | 6/1996 | Stone |
| 5,539,241 A | | 7/1996 | Abidi et al. |
| 5,770,476 A | | 6/1998 | Stone |
| 5,818,079 A | | 10/1998 | Noma et al. |
| 5,928,968 A | | 7/1999 | Bothra et al. |
| 5,982,018 A | | 11/1999 | Wark et al. |

(List continued on next page.)

FOREIGN PATENT DOCUMENTS

| | | | |
|---|---|---|---|
| JP | 5-218042 | | 8/1993 |
| JP | 05218042 A | * | 8/1993 ......... H01L/21/321 |

OTHER PUBLICATIONS van Zant, Microchip Fabrication: A Practical Guide to Semiconductor Processing, 4th ed., 2000, McGrawHill, New York, pp. 3.*
Co–pending related U.S. Appl. No. 09/924,293, filed Aug. 8, 2001; Inventors: Iwao Tahara, et al.

Primary Examiner—Long Pham
Assistant Examiner—Marcos D. Pizarro-Crespo
(74) Attorney, Agent, or Firm—Frishauf, Holtz, Goodman & Chick, P.C.

(57) ABSTRACT

In a semiconductor device, re-wiring is provided on a circuit element formation region of a semiconductor substrate. A columnar electrode for connection with a circuit board is provided on the rewiring. A first insulating film is provided over the semiconductor substrate excluding a connection pad, and a ground potential layer connected to a ground potential is provided on an upper surface of the first insulating film. A re-wiring is provided over the ground potential layer with a second insulating film interposed. The ground potential layer serves as a barrier layer for preventing crosstalk between the re-wiring and circuit element formation region. A thin-film circuit element is provided on the second insulating film, and a second ground potential layer is provided as a second barrier layer over the thin-film circuit element with an insulating film interposed. Re-wiring is provided over the second ground potential layer.

5 Claims, 8 Drawing Sheets

U.S. PATENT DOCUMENTS

| | | |
|---|---|---|
| 5,990,507 A | 11/1999 | Mochizuki et al. |
| 6,002,161 A | 12/1999 | Yamazaki |
| 6,025,218 A | 2/2000 | Brotherton |
| 6,031,293 A | 2/2000 | Hsuan et al. |
| 6,108,212 A | 8/2000 | Lach et al. |
| 6,124,606 A | 9/2000 | den Boer et al. |
| 6,140,155 A | 10/2000 | Mihara et al. |
| 6,163,456 A | 12/2000 | Suzuki et al. |
| 6,180,976 B1 * | 1/2001 | Roy ............................ 257/306 |
| 6,274,937 B1 | 8/2001 | Ahn et al. |
| 6,331,722 B1 | 12/2001 | Yamazaki et al. |
| 6,337,517 B1 | 1/2002 | Ohta et al. |
| 6,362,523 B1 | 3/2002 | Fukuda |
| 6,545,354 B1 | 4/2003 | Aoki et al. |
| 2002/0017730 A1 | 2/2002 | Tahara et al. |

\* cited by examiner

SEMICONDUCTOR DEVICE HAVING A THIN-FILM CIRCUIT ELEMENT PROVIDED ABOVE AN INTEGRATED CIRCUIT

CROSS-REFERENCE TO RELATED APPLICATIONS

This is a continuation of application Ser. No. 09/499,599 filed on Feb. 7, 2000, now U.S. Pat. No. 6,545,354, the entire disclosure of which is incorporated herein by reference.

BACKGROUND OF THE INVENTION

The present invention relates to a semiconductor device having columnar electrodes on re-wiring.

There is known a semiconductor device called CSP (Chip Size Package). When the semiconductor device is to be mounted on a circuit board, a mounting technique called "face down bonding" is employed. In the case of this type of semiconductor device, columnar electrodes for connection with the circuit board, etc. are provided on a semiconductor substrate or via an intermediate substrate (interposer). FIG. 7A is a cross-sectional view showing an example of this type of conventional semiconductor device, and FIG. 7B is a cross-sectional view taken along line 7B—7B in FIG. 7A in the state in which a protection film 5 and the elements provided thereon are removed. This semiconductor device includes a semiconductor substrate 1 which is, e.g. a silicon substrate.

The semiconductor substrate 1 has a rectangular shape, as shown in FIG. 7B. A central region defined by a dot-and-dash line in FIG. 7B serves as a circuit element formation region 2. Where the semiconductor device is an LSI for driving a liquid crystal display panel, an oscillation circuit, a regulator circuit, an LC driver circuit, etc., although not shown, are provided in the circuit element formation region 2. A plurality of connection pads 3 are provided on an upper surface of the semiconductor substrate 1 on the outside of the circuit element formation region 2. Each connection pad 3 is formed of one end portion of a wiring segment 3a extended from the circuit element formation region 2 of semiconductor device 1. Each connection pad 3 is connected to the LC driver circuit, etc. via the wiring segment 3a.

An insulating film 4 formed of, e.g. a semiconductor oxide, and protection film 5 formed of, e.g. polyimide are successively provided on the upper surface of semiconductor substrate 1 excluding the central portion of each connection pad. Thus, the central portion of the connection pad 3 is exposed via an opening portion 6 defined by the protection film 5. A re-wiring segment 7 is provided so as to extend from the exposed upper surface of the connection pad 3 to an upper surface of the protection film 5 on the circuit element formation region 2. A distal end portion of the re-wiring segment 7 functions as an external connection pad portion 7a. A columnar electrode 8 is provided on an upper surface of the external connection pad portion 7a. A sealing film 9 made of, e.g. an epoxy resin is provided over the entire upper surface of the assembly excluding the columnar electrodes 8. Although not shown, solder bumps are provided on the columnar electrodes 8, and this semiconductor device is connected to a circuit board, etc. via the solder bumps.

In the above semiconductor device, the re-wiring segments 7 are provided on the protection film 5 in the circuit element formation region 2, as mentioned above. Various signals flow through the re-wiring segments 7 since the re-wiring segments 7 function as interconnection wiring between the external circuit board, etc., on the one hand, and the circuits provided within the circuit element formation region 2, on the other. It is thus necessary to prevent crosstalk between the re-wiring segments 7 and the oscillation circuit, etc. provided in the circuit element formation region 2. For this purpose, it is necessary in the prior art to dispose the re-wiring segments 7 so as not to overlap in plan the oscillation circuit, etc. Because of this, the re-wiring segments 7 cannot freely be arranged, and there are very serious limitations to the design thereof.

BRIEF SUMMARY OF THE INVENTION

The object of the present invention is to provide a semiconductor device, such as a CSP, having a re-wiring provided over a circuit element formation region of a semiconductor substrate, and having columnar electrodes for connection with a circuit board provided on the re-wiring, wherein the re-wiring can be freely positioned without restrictions.

In order to achieve the above object, the present invention provides a first semiconductor device including a semiconductor substrate which has a circuit element formation region at a central portion thereof and a plurality of connection pads at a peripheral portion of the circuit element formation region. A first insulating film is provided over an upper surface of the semiconductor substrate excluding the connection pads. A ground potential layer connected to the connection pads with ground potential is provided on an upper surface of the first insulating film over the circuit element formation region, and a re-wiring is provided over the ground potential layer with a second insulating film interposed. Since the ground potential layer serving as a barrier layer for preventing crosstalk is provided between the re-wiring and circuit element formation region, even if the re-wiring overlaps in plan an oscillation circuit, etc. provided within the circuit element formation region, they are electrically insulated by the ground potential layer and no crosstalk occurs therebetween. Therefore, the re-wiring can be freely arranged with no restrictions.

Alternately, in order to achieve the above object, the invention provides a second semiconductor device which, like the above-described device, the ground potential layer is provided over the circuit element formation region with the insulating film interposed, and, in addition, a thin-film circuit element such as a thin-film inductor and/or a thin-film transformer is provided over the ground potential layer with an insulating film interposed. Since the ground potential layer serving as a barrier layer for preventing crosstalk is provided between the thin-film circuit element and circuit element formation region, even if the thin-film circuit element overlaps in plan an oscillation circuit, etc. provided within the circuit element formation region, they are electrically insulated by the ground potential layer and no crosstalk occurs therebetween. Therefore, the thin-film circuit element can be freely arranged with no restrictions.

In order to achieve the above object, in the third semiconductor device, as described above, a first ground potential layer is provided over the circuit element formation region with an insulating film interposed, and a thin-film circuit element is provided over the first ground potential layer with an insulating film interposed. In addition, a second ground potential layer is provided over the thin-film circuit element with an insulating film interposed, and a re-wiring connected to the connection pads is provided over the second ground potential layer with an insulating film interposed. Since the first ground potential layer serving as a barrier layer prevents crosstalk between the thin-film circuit element and the oscillation circuit, etc. on the circuit element formation region, the thin-film circuit element can be freely arranged with no restrictions. Moreover, the second ground potential layer serving as a barrier layer prevents crosstalk between the re-wiring and the thin-film circuit element, and the re-wiring can be freely arranged with no restrictions.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION

A semiconductor device according to the present invention and a method of manufacturing the same will now be described in detail on the basis of embodiments shown in the accompanying drawings.

Figure 1A:
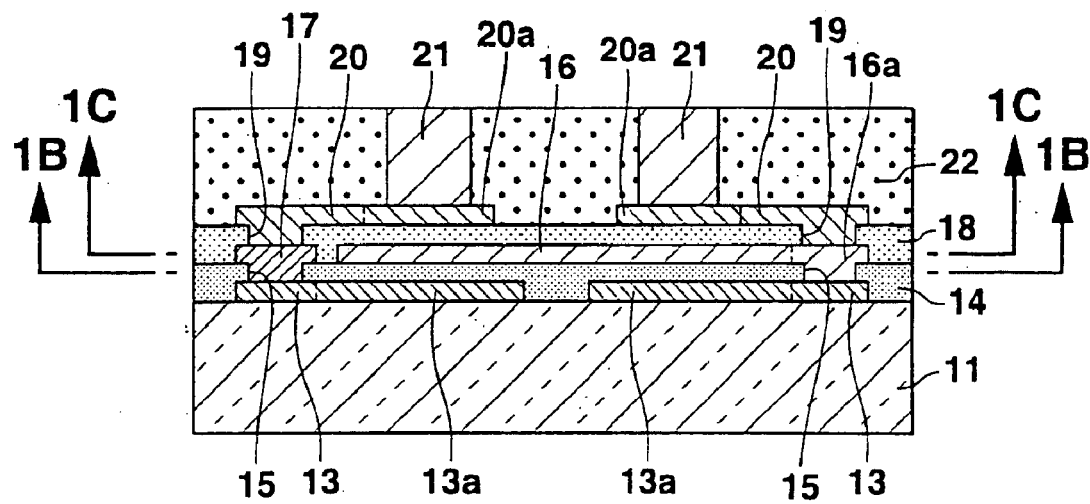
FIG. 1A is a cross-sectional view schematically showing a semiconductor device according to a first embodiment of the present invention.
Figure 1B:
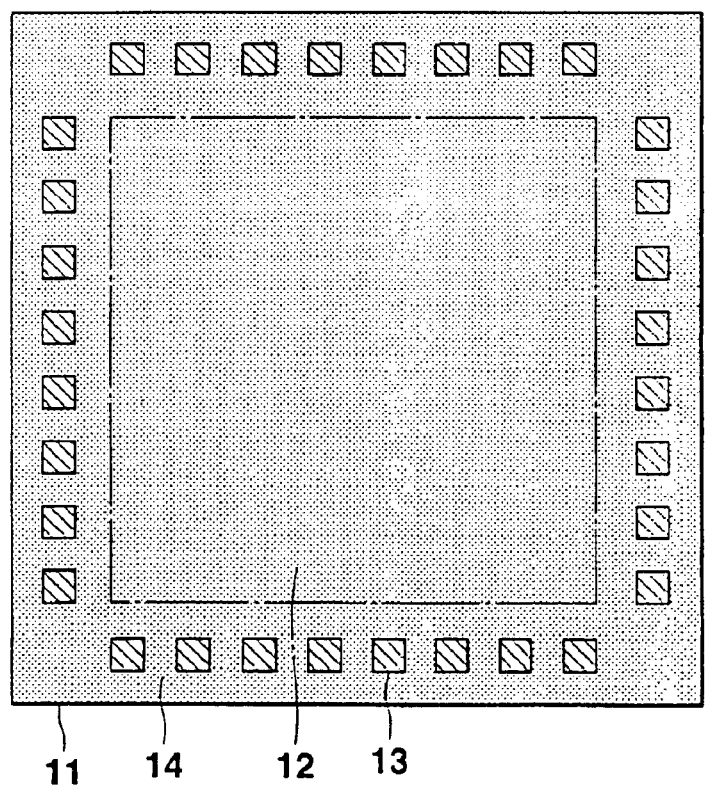
FIG. 1B is a cross-sectional view taken along line 1B—1B in FIG. 1A.

FIG. 1A shows a semiconductor device according to a first embodiment of the present invention. FIG. 1B is a cross-sectional view taken along line 1B—1B in FIG. 1A in a state in which connection pad portions 17 are removed. This semiconductor device has a semiconductor substrate 11.

The semiconductor substrate 11 has a rectangular shape, as shown in FIG. 1B. A central region defined by a dot-and-dash line in FIG. 1B serves as a circuit element formation region 12. Where the semiconductor device is an LSI for driving a liquid crystal display panel, an oscillation circuit, a regulator circuit, an LC driver circuit, etc., although not shown, are provided in the circuit element formation region 12. A plurality of connection pads 13 are provided on an upper surface of the semiconductor substrate 11 on the outside of the circuit element formation region 12. Each connection pad 13 is formed of one end portion of a wiring segment 13a extended from the circuit element formation region 12 of semiconductor device 11. Each connection pad 13 is connected to the LC driver circuit, etc. via the wiring segment 13a.

Figure 1C:
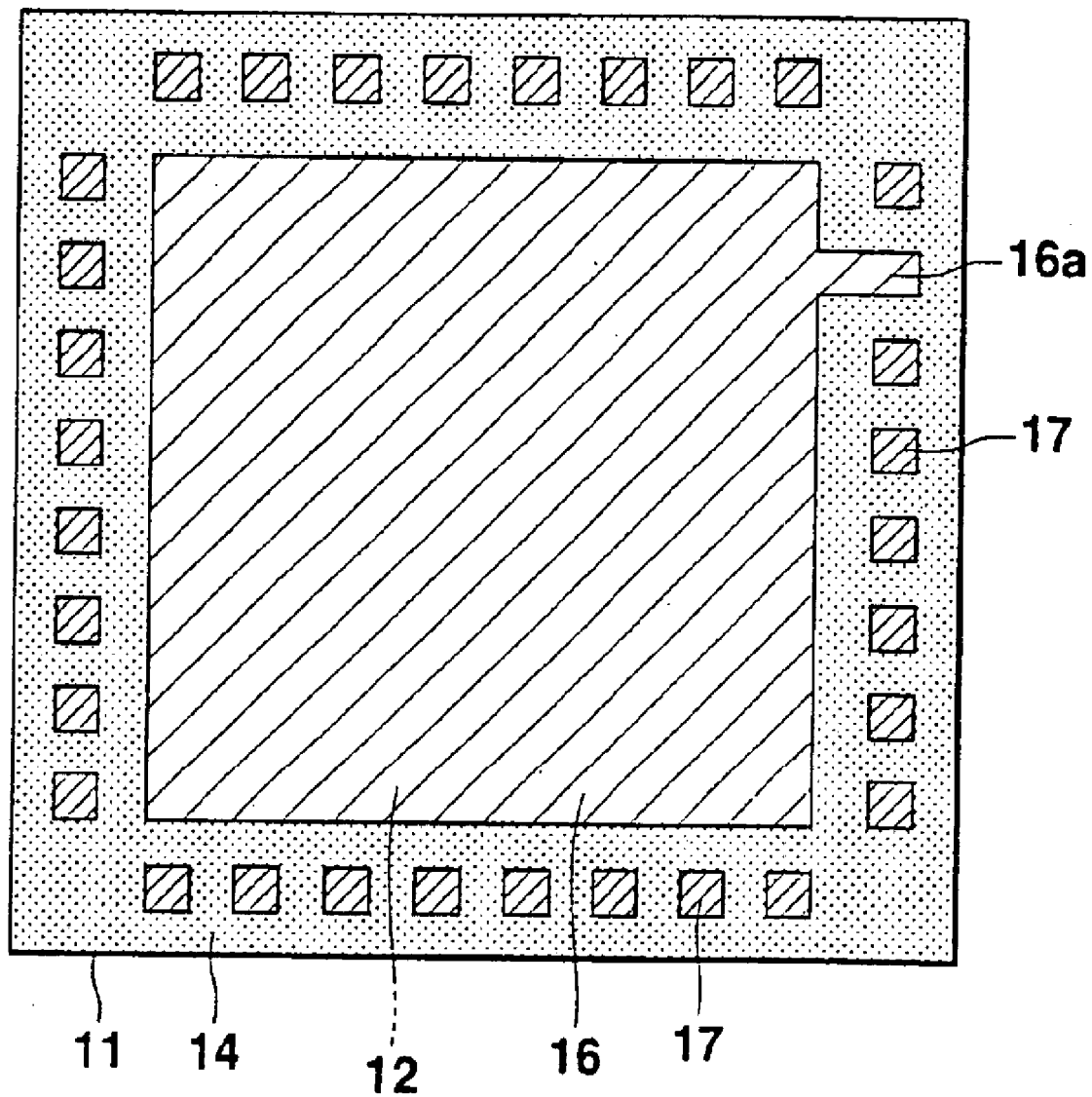
FIG. 1C is a cross-sectional view taken along line 1C—1C in FIG. 1A.

A first insulating film 14 of silicon oxide, etc. is provided on an upper surface of each connection pad 13 excluding a central portion thereof and an upper surface of the semiconductor substrate 11. The central portion of the connection pad 13 is exposed via an opening portion 15 defined by the first insulating film 14. There are a plurality of such exposed portions of connection pads 13, as shown in FIG. 1B. A ground potential layer 16 of a conductive material is provided to extend from the exposed upper surface of that one of the connection pads 13, which is connected to a ground potential, over the first insulating film 14 in the circuit element formation region 12. Accordingly, the circuit element formation region 12 is covered with the ground potential layer 16, as shown in FIG. 1C, which is a cross-sectional view taken along line 1C—1C in FIG. 1A in a state in which a second insulating film 18 is removed. In this case, the portion of the layer 16 on the connection pad 13 connected to the ground potential constitutes a connection pad portion 16a, and connection pad portions 17 are provided on the other connection pads 13.

The second insulating film 18, which is formed of polyimide, etc., is provided on the connection pad portions 16a, 17 excluding the central portion thereof, and on the first insulating film 14 and ground potential layer 16. The central portions of the connection pad portions 16a, 17 are respectively exposed via opening portions formed in the second insulating film 18. A re-wiring segment 20 is provided to extend from the exposed central upper surface of each of the connection pad portions 16a, 17 over the second insulating film 18 lying on the ground potential layer 16 in the circuit element formation region 12. A distal end portion of the re-wiring segment 20 constitutes an external connection pad portion 20a. A columnar electrode 21 is provided on the upper surface of the external connection pad portion 20a. That one of the columnar electrodes 21, which is connected to the re-wiring segment 20 electrically connected to the connection pad portion 16a, serves as a ground electrode and is electrically connected to the ground potential layer 16. A sealing film 22 of an epoxy resin, etc. is provided on the entire upper surface of the assembly excluding the columnar electrodes 21.

As has been described above, in this semiconductor device, the re-wiring segments 20 are provided above the ground potential layer 16, which is formed on the first insulating layer 14 in the circuit element formation region 12. The second insulating film 18 is positioned between the ground potential layer 16 and the re-wiring segments 20. Accordingly, even if the re-wiring segments 20 overlap the oscillation circuit, etc. provided within the circuit element formation region 12, they are electrically insulated by the ground potential layer 16 serving as a barrier layer and no crosstalk occurs therebetween. Therefore, the re-wiring segments 20 can be freely arranged with no restrictions.

Figure 2A:
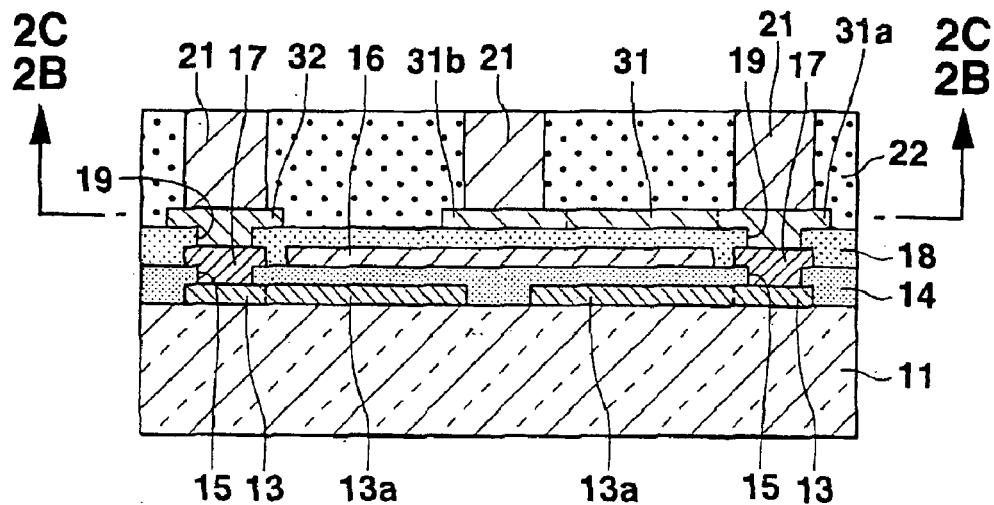
FIG. 2A is a cross-sectional view schematically showing a semiconductor device according to a second embodiment of the invention.
Figure 2B:
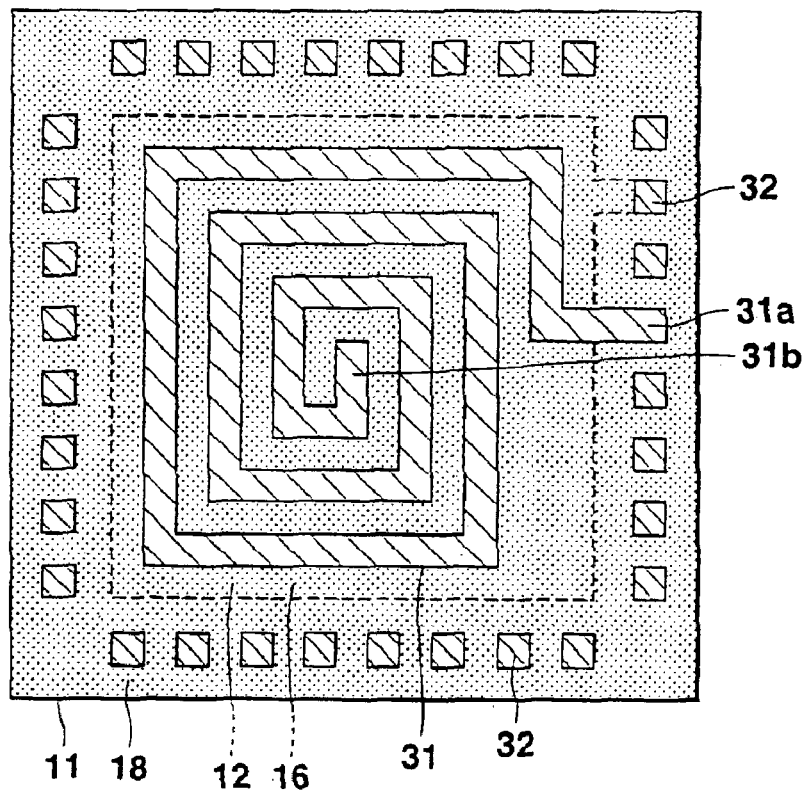
FIG. 2B is a cross-sectional view taken along line 2B—2B in FIG. 2A, in which a thin-film inductor is used as a thin-film circuit element in the semiconductor device.

A semiconductor device according to a second embodiment of the present invention will now be described with reference to FIG. 2A. In this semiconductor device, the second insulating film 18 with opening portions 19 and the portions thereunder have the same construction as the first embodiment shown in FIG. 1A. These elements are denoted by like reference numerals, and a description thereof is omitted. In the second embodiment, as is shown in FIG. 2B or a cross-sectional view taken along line 2B—2B in FIG. 2A, a thin-film inductor 31 formed of rectangular-spiral wiring is provided to extend from an upper surface of a predetermined one of the connection pad portions 17 onto the second insulating film 18 on the ground potential layer 16 in the circuit element formation region 12. In this case, both end portions of the thin-film inductor 31 constitute connection pad portions 31a, 31b. Connection pad portions 32 are provided on the other connection pads 17. Columnar electrodes 21 are provided on upper surfaces of the connection pad portions 31a, 31b, 32, respectively. Both columnar electrodes 21 provided on the connection pad portions 31a, 31b function as terminals of the thin-film inductor 31. A sealing film 22 of an epoxy resin, etc. is provided on the entire surface of the assembly excluding the columnar electrodes 21.

As has been described above, in this semiconductor device, too, the thin-film inductor 31 is provided on the ground potential layer 16 through the second insulating film 18 therebetween, which is formed over the circuit element formation region 12 with the first insulating layer 14 interposed. Accordingly, even if the thin-film inductor 31 overlaps the oscillation circuit, etc. provided within the circuit element formation region 12, they are electrically insulated by the ground potential layer 16 serving as a barrier layer and no crosstalk occurs therebetween. Therefore, the thin-film inductor 31 can be freely arranged with no restrictions.

Figure 2C:
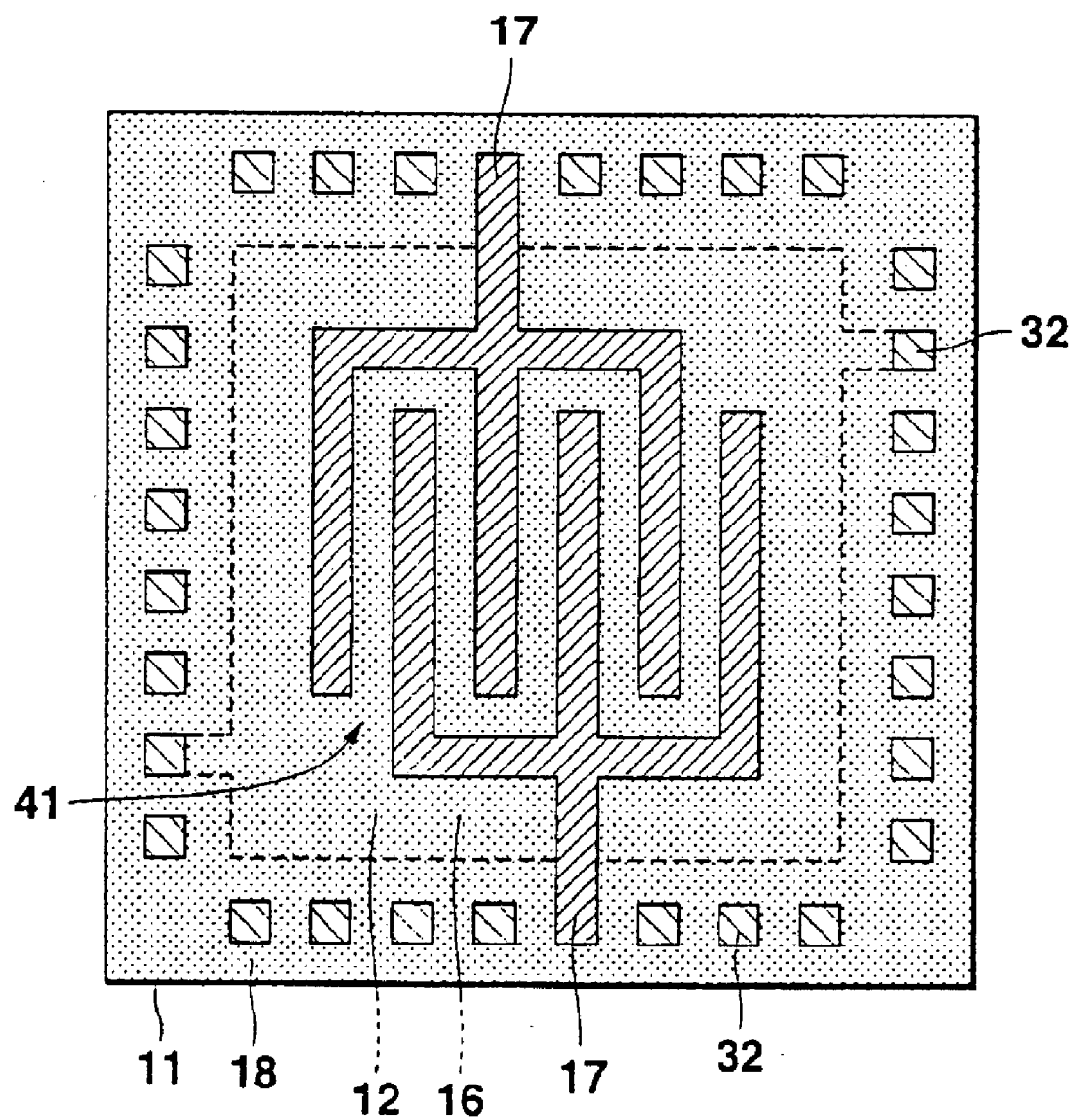
FIG. 2C is a cross-sectional view taken along line 2C—2C in FIG. 2A, in which a thin-film SAW (Surface-Acoustic-Wave) filter is used as the thin-film circuit element according to a third embodiment of the invention.

A third embodiment of the invention will now be described with reference to FIG. 2C. FIG. 2C, like FIG. 2B, is a cross-sectional view taken along line 2C—2C in FIG. 2A. A thin-film SAW (Surface Acoustic Wave) filter 41 comprising a pair of interlaced tooth-shaped wiring segments is provided to extend from upper surfaces of predetermined two of the connection pad portions 17 onto the second insulating film 18 provided on the ground potential layer 16 in the circuit element formation region 12. In this case, like the second embodiment, the thin-film SAW filter 41 can be freely arranged without restrictions by virtue of the ground potential layer 16 serving as a barrier layer.

Specifically, in the semiconductor devices according to the second and third embodiments, a thin-film circuit element formed of single-layer wiring is provided in a circuit element formation region with an insulating film interposed, and a ground potential layer serving as a barrier layer for preventing crosstalk is provided between the insulating layer and the circuit element formation region. Therefore, the thin-film circuit element can be freely arranged.

Figure 3A:
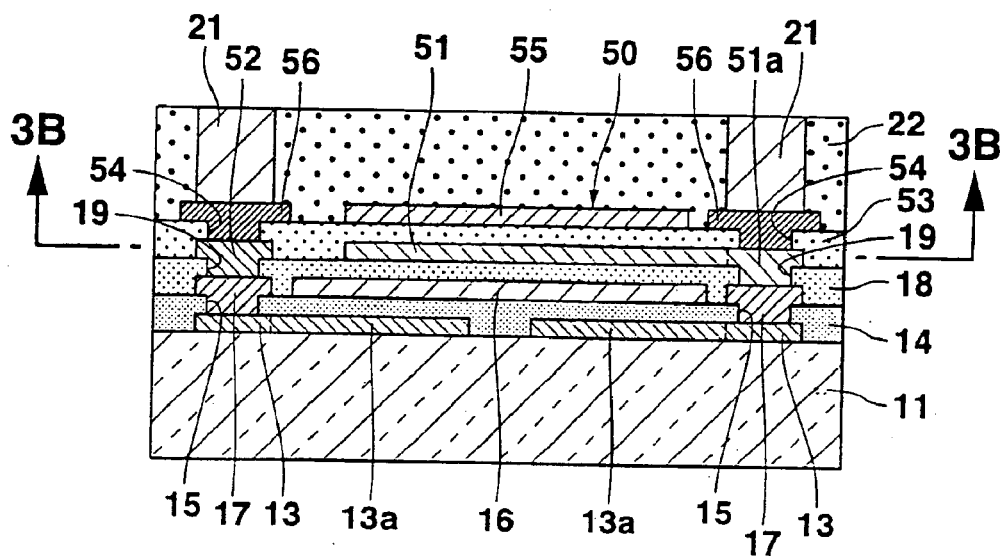
FIG. 3A is a cross-sectional view schematically showing a semiconductor device according to a fourth embodiment of the invention.
Figure 3B:
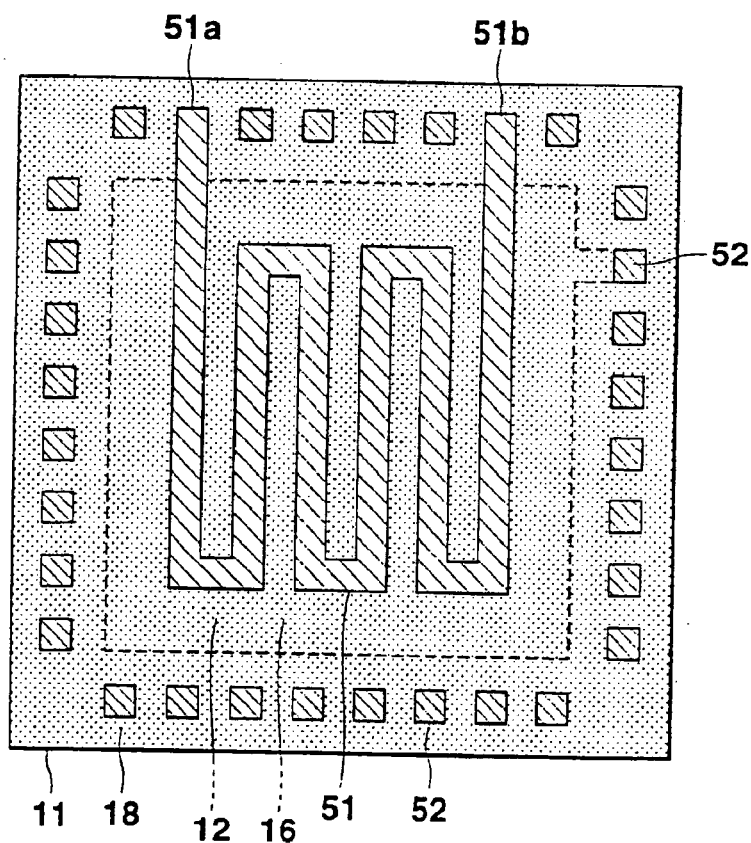
FIG. 3B is a cross-sectional view taken along line 3B—3B in FIG. 3A.

A semiconductor device according to a fourth embodiment of the invention will now be described with reference to FIG. 3A. In this semiconductor device, the second insulating film 18 with opening portions 19 and the portions thereunder have the same construction as the first embodiment shown in FIG. 1A. These elements are denoted by like reference numerals, and a description thereof is omitted. In the fourth embodiment, as is shown in FIG. 3B or a cross-sectional view taken along line 3B—3B in FIG. 3A with a third insulating film 53 and elements thereon removed, a primary conductor layer 51 formed of meandering wiring is provided to extend from upper surfaces of predetermined two connection pads onto the second insulating film 18 formed on the ground potential layer 16 in the circuit element formation region 12. In this case, both end portions of the primary conductor layer 51, which are located on the two connection pad portions 17, constitute connection pad portions 51a, 51b. In addition, connection pad portions 52 are provided on the other connection pad portions 17. The third insulating film 53 of a polyimide, etc. is provided on those portions of the connection pad portions 51a, 51b, 52, which exclude their central portions, and on the upper surfaces of the second insulating film 18 and primary conductor layer 51. The central portions of the connection pad portions 51a, 51b, 52 are exposed via opening portions 54 formed in the third insulating film 53. A secondary conductor layer 55 formed of meandering wiring is provided so as to extend from upper surfaces of predetermined two connection pad portions 52 onto an upper surface of the third insulating film 53 and to substantially overlap the primary conductor layer 51. The conductor layers 51, 55 and the third insulating film 53 provided therebetween constitute a thin-film transformer 50. Connection pads 56 are provided on the other connection pad portions 52 and connection pad portions 51a, 51b, and columnar electrodes 21 are provided on upper surfaces of the connection pads 56. In this case, predetermined four of the columnar electrodes 21 serve as terminals of the thin-film transformer 50. A sealing film 22 of an epoxy resin, etc. is provided on the entire upper surface of the assembly excluding the columnar electrodes 21.

As has been described above, in this semiconductor device, the thin-film transformer 50 constituted by both conductor layers 51, 55 and the intervening third insulating film 53 is provided over the ground potential layer 16, which is formed over the circuit element formation region 12 with the first insulating layer 14 interposed, with the second insulating film 18 lying between the ground potential layer 16 and the thin-film transformer 50. Since the ground potential layer serving as a barrier layer is provided, even if the thin-film transformer 50 overlaps the oscillation circuit, etc. provided within the circuit element formation region 12, no crosstalk occurs therebetween. Therefore, the thin-film transformer 50 can be freely arranged with no restrictions.

Figure 4A:
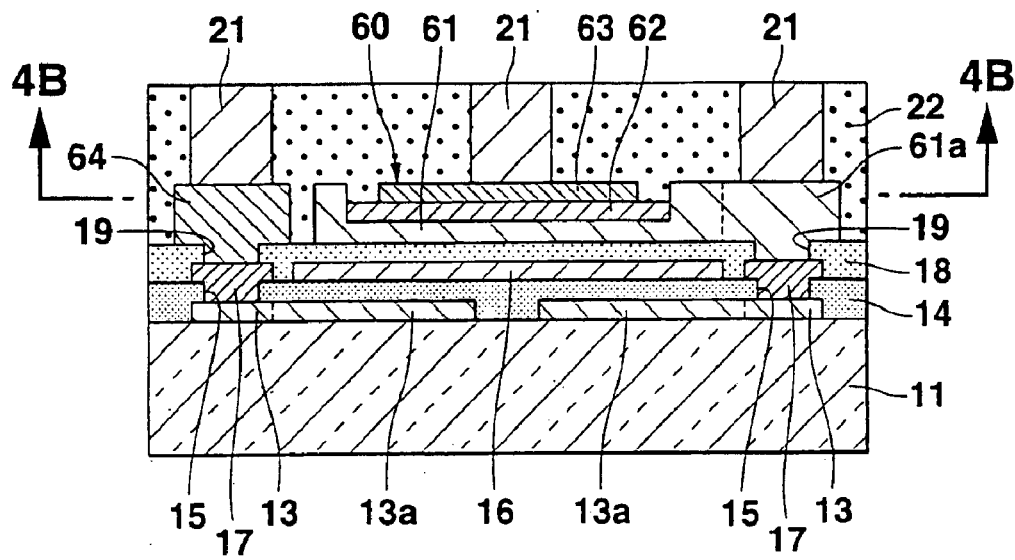
FIG. 4A is a cross-sectional view schematically showing a semiconductor device according to a fifth embodiment of the invention.
Figure 4B:
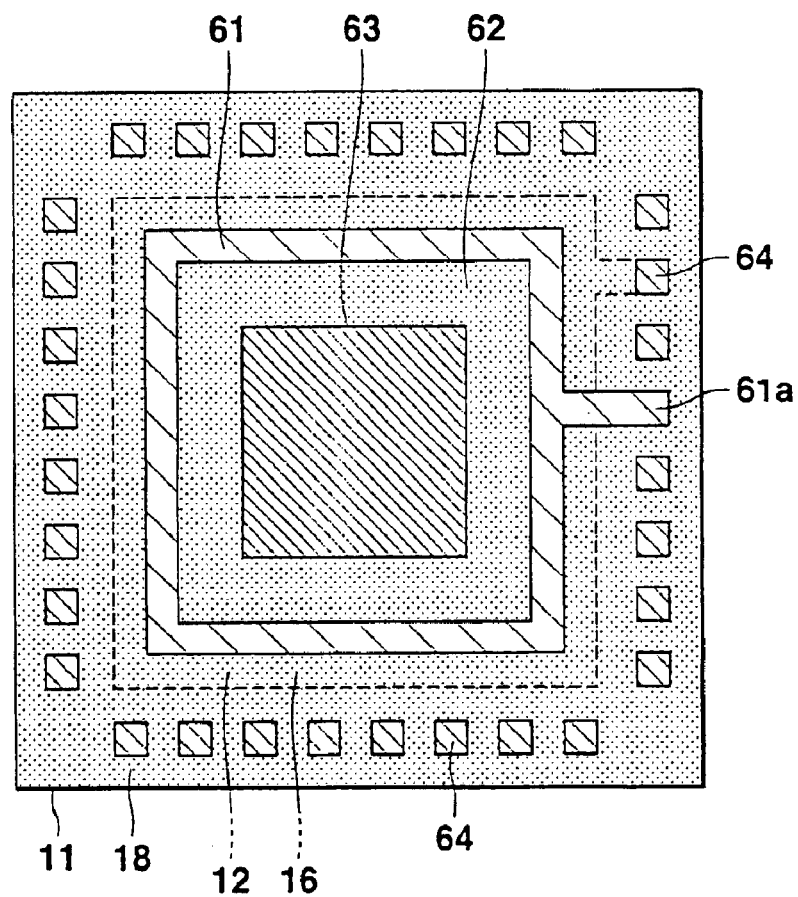
FIG. 4B is a cross-sectional view taken along line 4B—4B in FIG. 4A.

A semiconductor device according to a fifth embodiment of the invention will now be described with reference to FIG. 4A. In this semiconductor device, too, the second insulating film 18 with opening portions 19 and the portions thereunder have the same construction as the first embodiment shown in FIG. 1A. These elements are denoted by like reference numerals, and a description thereof is omitted. In the fifth embodiment, as is shown in FIG. 4B or a cross-sectional view taken along line 4B—4B in FIG. 4A with the sealing film 22 removed, a relatively large square lower conductor layer 61 is provided on the second insulating film 18 to substantially face the ground potential layer 16 through the film 18, in the circuit element formation region 12. The conductor layer 61 has a projection which extends to an upper surface of a predetermined one of connection pad portions 17. A relatively small square upper conductor layer 63 is provided on the lower conductor layer 61, through a square insulating layer 62 interposed. Both conductor layers 61, 63 and the intervening insulating layer 62 constitute a thin-film capacitor 60.

That portion of the lower conductor layer 61, which is electrically connected to the connection pad 17 is formed as a connection pad portion 61a. Connection pad portions 64 are provided on the other connection pads 17. Columnar electrodes 21 are provided on central portions of upper surfaces of the connection pad portions 61a, 64 and upper conductor layer 63. In this case, two columnar electrodes 21 provided on the connection pad portion 61a and upper conductor layer 63 constitute terminals of the thin-film capacitor 60. A sealing film 22 of an epoxy resin, etc. is provided on the entire upper surface of the assembly excluding the columnar electrodes 21.

As has been described above, in this semiconductor device, too, the thin-film capacitor 60 constituted by both conductor layers 61, 63 and the intervening third insulating layer 62 is provided on the ground potential layer 16, which is formed in the circuit element formation region 12, through the first insulating layer 14 interposed, with the second insulating film 18 lying between the ground potential layer 16 and the thin-film capacitor 60. Since the ground potential layer 16 serving as a barrier layer is provided, even if the thin-film capacitor 60 overlaps the oscillation circuit, etc. provided within the circuit element formation region 12, no crosstalk occurs therebetween. Therefore, the thin-film capacitor 60 can be freely arranged with no restrictions.

Specifically, in the semiconductor devices according to the fourth and fifth embodiments, a thin-film circuit element formed of plural wiring layers and plural insulating layers is provided on a circuit element formation region with an insulating film interposed, and a ground potential layer serving as a barrier layer for preventing crosstalk is provided between the insulating layer and the circuit element formation region. Therefore, the thin-film circuit element can be freely arranged.

Figure 5:
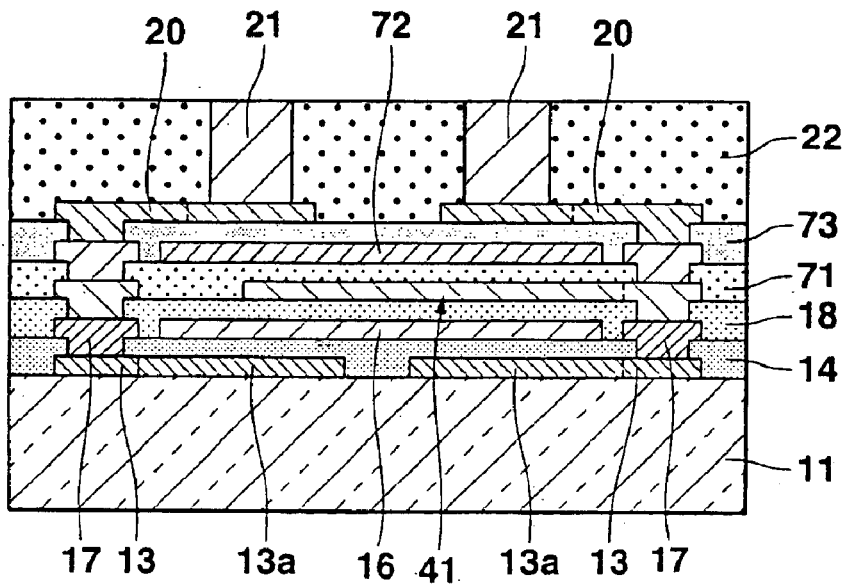
FIG. 5 is a cross-sectional view schematically showing a semiconductor device according to a sixth embodiment of the invention.

FIG. 5 is a cross-sectional view showing a semiconductor device according to a sixth embodiment of the invention. In this semiconductor device, too, the second insulating film 18 with opening portions 19 and the portions thereunder have the same construction as the first embodiment shown in FIG. 1A. These elements are denoted by like reference numerals, and a description thereof is omitted. In the sixth embodiment, for example, the thin-film SAW filter 41 shown in FIG. 2C is provided on the second insulating film 18. A third insulating film 71 of a polyimide, etc. covers the thin-film SAW filter 41. A second ground potential layer 72 is provided on the third insulating film 71. A fourth insulating film 73 of a polyimide, etc. is provided on the second ground potential layer 72 to cover one. The same re-wiring segments 20 as shown in FIG. 1A are provided on the fourth insulating film 73 and electrically connected to the connection pads 13, respectively. The columnar electrode 21 is provided on the re-wiring segment 20, and the sealing film 22 of an epoxy resin, etc. is provided on the entire upper surface of the assembly excluding the columnar electrode 21.

In this structure, since the first ground potential layer 16 serving as a first barrier layer is provided, crosstalk between the thin-film circuit element such as the thin-film SAW filter 41 and the oscillation circuit, etc. provided within the circuit element formation region 12 is prevented, and the thin-film circuit element can be positioned without restrictions. In addition, since the second ground potential layer 72 serving as a second barrier layer is provided, crosstalk between the re-wiring segment 20 and the thin-film circuit element such as the thin-film SAW filter 41 is prevented, and the re-wiring segment 20 can be positioned without restrictions.

Figure 6:
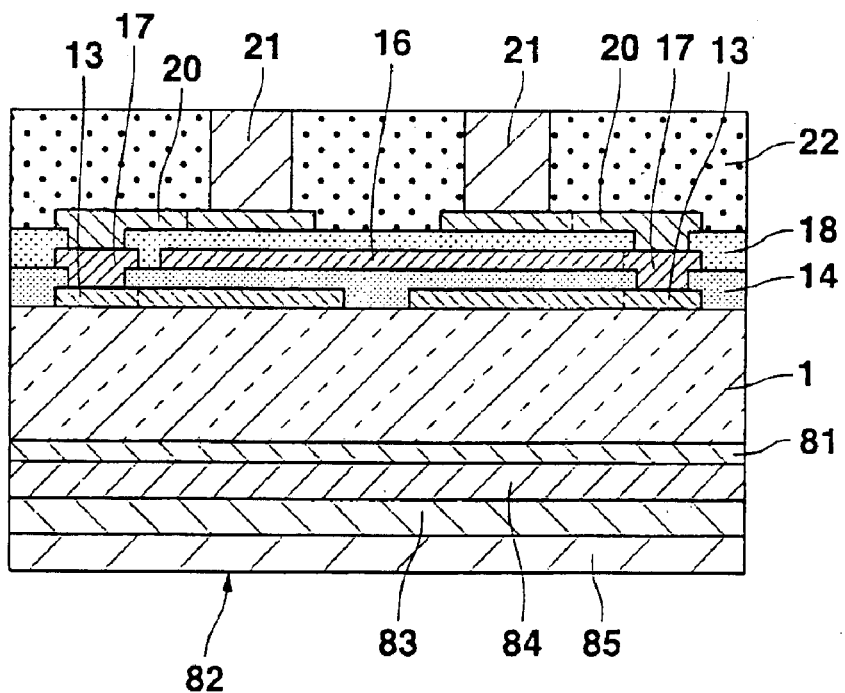
FIG. 6 is a cross-sectional view schematically showing a semiconductor device according to a seventh embodiment of the invention.
Figure 7A:
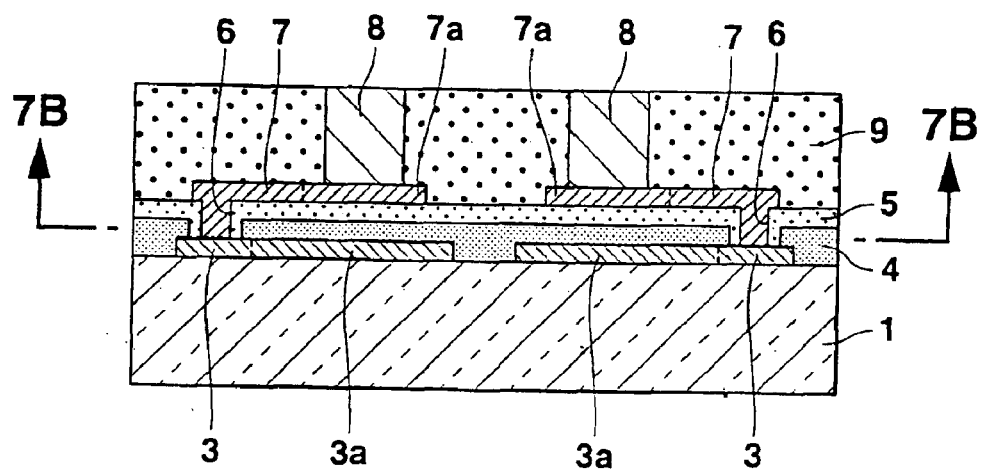
FIG. 7A is a cross-sectional view schematically showing a semiconductor device having re-wiring according to a prior-art structure.
Figure 7B:
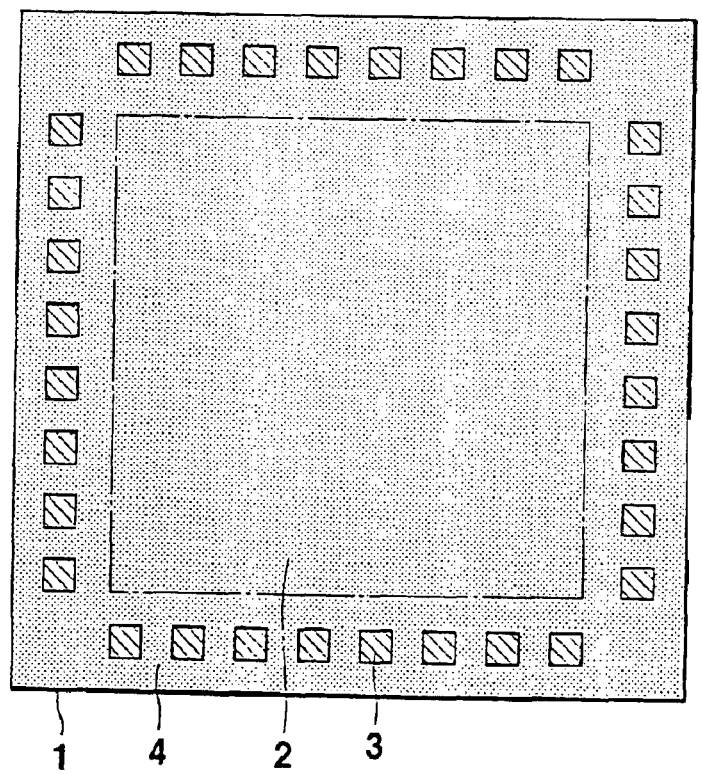
FIG. 7B is a cross-sectional view taken along line 7B—7B in FIG. 7A.

FIG. 6 is a cross-sectional view showing a semiconductor device according to a seventh embodiment of the invention. In this semiconductor device, the elements above the semiconductor substrate 11 have the same construction as the first embodiment shown in FIG. 1A. These elements are denoted by like reference numerals, and a description thereof is omitted. A film-like capacitor 82 is provided on a lower surface of the semiconductor substrate 11 with an adhesive agent 81 interposed. The film-like capacitor 82 comprises an insulating film 83 and conductor layers 84, 85 laminated on upper and lower surfaces of the insulating film 83. A planar circuit element such as a film-like resistor may be substituted for the film-like capacitor 82 and adhered to the lower surface of the semiconductor substrate 11. In the seventh embodiment, the upper part provided on the semiconductor substrate 11 has the same structure as in the first embodiment but needless to say, it may be replaced with the structure in the second to sixth embodiments.

In the above-described embodiments, the thin-film inductor, thin-film SAW filter, thin-film transformer or thin-film capacitor is provided on the semiconductor substrate with the ground potential layer interposed. However, another thin-film circuit element such as a microstrip line or an MMIC (Microwave Monolithic Integrated Circuit). In the above embodiments, the ground potential layer is provided as a barrier layer for preventing crosstalk. The ground potential layer, however, may be replaced with a power supply potential layer or an electromagnetic wave absorption layer of a multi-thin-film structure.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor device comprising:

a semiconductor substrate having a circuit element formation region, in which an integrated circuit is formed, and a plurality of connection pads;

a thin-film circuit element comprising a passive element over the circuit element formation region through an insulating film and a plurality of terminals connected to the passive element, the plurality of terminals being connected to the integrated circuit through at least one of the plurality of connection pads, the thin-film circuit element having one surface facing the integrated circuit and the other surface opposing the one surface, and the plurality of terminals being provided on the one and the other surfaces;

at least one straight-shaped columnar electrode provided on at least one of the plurality of terminals on the other surface of the thin-film circuit element, and having an exposed top end face for coupling to an outer circuit; and a sealing film which covers the thin-film circuit element and the semiconductor substrate except for the top end face of the straight-shaped columnar electrode.

2. A semiconductor device according to claim 1, wherein:

at least one of the plurality of terminals is connected to at least one of the plurality of connection pads, and at least one of the plurality of terminals which is not connected to one of the plurality of connection pads, is provided with the at least one straight-shaped columnar electrode thereon.

3. A semiconductor device according to claim 1, wherein:

at least one of the plurality of terminals is connected to at least one of the plurality of connection pads, and each of the terminals is provided with a straight-shaped columnar electrode thereon.

4. A semiconductor device according to claim 1, wherein:

the thin-film circuit element comprises at least one insulating film, and at least two conductor layers provided through the at least one insulating film, the plurality of terminals are formed by the conductor layers, at least one of the plurality of terminals of one of the at least two conductor layers is connected to at least one of the plurality of connection pads, and at least one of the plurality of terminals of another of the at least two conductor layers is provided with the at least one straight-shaped columnar electrode thereon.

5. A semiconductor device according to claim 1, wherein:

the thin-film circuit element comprises at least one insulating film, and at least two conductor layers provided through the at least one insulating film, at least one of the plurality of terminals formed of each conductor layer is connected to at least one of the plurality of connection pads, and each conductor layer is provided with a straight-shaped columnar electrode thereon.

* * * * *